United States Patent
Goller et al.

(10) Patent No.: US 7,666,783 B2
(45) Date of Patent: Feb. 23, 2010

(54) METHOD AND ARRANGEMENT FOR CONTACTING TERMINALS

(75) Inventors: Klaus Goller, Dresden (DE); Alexander Reb, Dresden (DE); Grit Schwalbe, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 188 days.

(21) Appl. No.: 11/985,686

(22) Filed: Nov. 16, 2007

(65) Prior Publication Data

US 2008/0070403 A1    Mar. 20, 2008

Related U.S. Application Data

(62) Division of application No. 10/775,748, filed on Feb. 10, 2004, now abandoned.

(30) Foreign Application Priority Data

Feb. 10, 2003  (DE) ................. 103 05 365

(51) Int. Cl.
H01L 21/4763 (2006.01)
(52) U.S. Cl. .............. 438/637; 257/758; 438/639
(58) Field of Classification Search ............ 438/637
See application file for complete search history.

(56) References Cited

U.S. PATENT DOCUMENTS

| | | | | |
|---|---|---|---|---|
| 5,451,543 A | * | 9/1995 | Woo et al. ........... | 438/637 |
| 5,760,429 A | * | 6/1998 | Yano et al. .......... | 257/211 |
| 5,891,799 A | * | 4/1999 | Tsui .................. | 438/624 |
| 5,943,598 A | * | 8/1999 | Lin ................... | 438/618 |
| 6,087,724 A | * | 7/2000 | Shields et al. ....... | 257/734 |
| 6,214,727 B1 | * | 4/2001 | Parekh ............... | 438/666 |
| 6,239,491 B1 | * | 5/2001 | Pasch et al. ......... | 257/750 |
| 6,492,731 B1 | * | 12/2002 | Catabay et al. ...... | 257/758 |
| 6,815,328 B2 | * | 11/2004 | Pio .................. | 438/618 |
| 6,836,019 B2 | * | 12/2004 | Yang et al. .......... | 257/774 |

* cited by examiner

*Primary Examiner*—Wael Fahmy
*Assistant Examiner*—Abul Kalam
(74) *Attorney, Agent, or Firm*—Maginiot, Moore & Beck

(57) ABSTRACT

In a method of contacting terminals, a substrate having a first terminal and a second terminal is provided, a terminal surface of the first terminal being located at a shorter distance from a substrate surface than a surface of the second terminal. A first insulating layer, in which a contact via is formed for exposing the terminal surface of the first terminal, is formed on the substrate surface. The contact via is filled with a conductive material, and a second insulating layer is formed on the first insulating layer and on the contact via filled with the conductive material. Using an etching mask, a first recess for exposing the conductive material filling the contact via, and a second recess are etched through the second and first insulating layers for exposing the second terminal surface. A conductive material for producing first and second contact terminals is introduced into the first and second recesses. This is to achieve that the second terminal is contacted in the production of the second contact terminal.

11 Claims, 6 Drawing Sheets

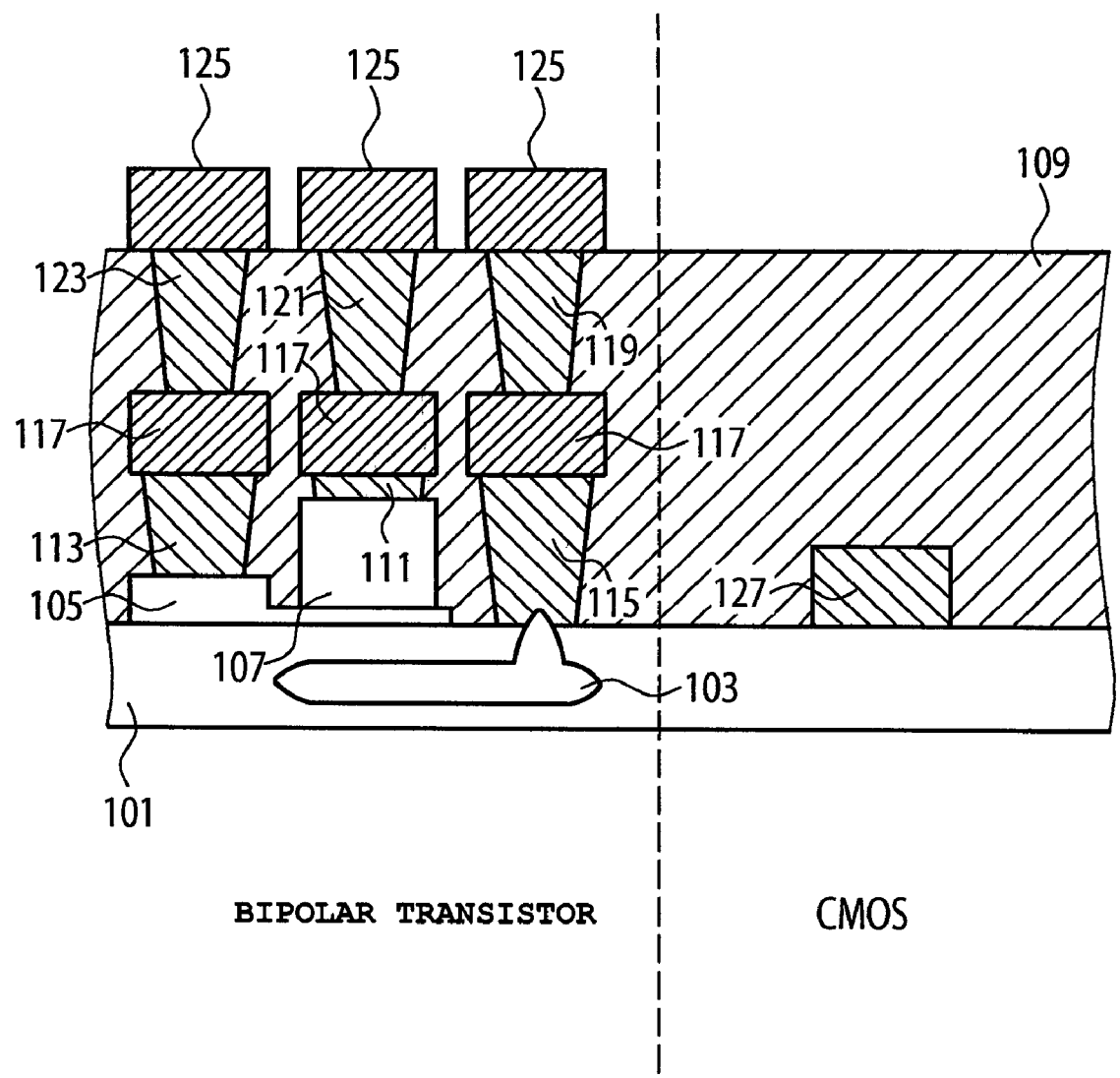

BIPOLAR TRANSISTOR | FIELD-EFFECT TRANSISTOR

METHOD AND ARRANGEMENT FOR CONTACTING TERMINALS

This application is a divisional of, and claims the benefit of, prior application Ser. No. 11/775,748, filed Feb. 10, 2004, which in turn claims the benefit of German Patent Application No. DE 103 05 365.4-33, filed Feb. 10, 2003.

BACKGROUND OF THE INVENTION

In known methods for producing a bipolar transistor, a base terminal, an emitter terminal and a collector terminal are created on a substrate. While doing so, during processing, the emitter terminal is configured to be clearly higher than the other terminals, such as the base terminal or a gate terminal. If, in particular, several bipolar transistors and/or several bipolar and field-effect transistors are produced on a substrate, this gives rise to the problem of efficiently contacting the respective terminals on the grounds of the emitter terminal being configured to be higher in each case.

FIG. 1 shows a semiconductor device having a substrate 101, a collector contact 103, a base contact 105 and an emitter contact 107, as are known from the prior art. A bipolar-transistor area is shown to the left of the vertical line drawn, and a CMOS area is shown to the right of the line. For producing the semiconductor device shown in FIG. 1, the substrate 101 is initially provided, wherein the collector contact 103 is formed. In a further process step, the base contact 105 is formed on substrate 101, and the emitter contact is produced, for example, on a portion of the base contact. After the end of the process, all devices are covered FEOL (front end of line) with a thin nitride liner and constantly, for example, with a BPSG layer (BPSG=boron phosphor silicate glass) 109, which layer will be polished back to a target thickness so as to planar in a further process step. For contacting contacts 105, 107 and 103, contact vias (CT) are etched into the BPSG until the respective terminal is reached, and are filled with tungsten, for example, after a liner deposition. The electrical contact of the transistors is therefore effected via the contact vias 111, 113 and 115 filled with tungsten. The etching is performed in two steps: Initially, the BPSG is fully etched, whereupon a portion of the nitride liner is recessed. In a further process step, a first structured metal plane 117 is applied to contact vias 111, 113 and 115 filled with tungsten, with which metal plane 117 a contacting of the respective contacts 111, 113, 115 is now produced in a plane. In a further process step, filling-up with oxide and planarization are performed, and further contact vias are etched up to the first metal plane 117 and filled up with tungsten. A second structured metal plane 125 which serves to contact the respective terminals 105, 107 and 103 is formed on the vias 119, 121 and 123 filled with tungsten.

If, additionally, a field-effect transistor is integrated on the substrate, a gate terminal (not shown in FIG. 1) will be integrated on a gate polystack 127. The gate polystack 127 is lower than, for example, the emitter contact 107.

Due to the larger height of the emitter contact 107 (emitter stack), a remaining oxide thickness above the emitter contact 107 is too small, in the etching of the contact vias, to achieve a sufficient overall process window. If, for example, too thin a BPSG layer is left over on the emitter contact 107 after the polishing step, the via 111 filled with tungsten may not be sufficiently structured to achieve a sufficiently conductive contact, so that possibly a large transition impedance towards the emitter contact 107 arises.

A further problem occurring in connection with the production of the semiconductor device shown in FIG. 1 is the fact that, due to the differing heights of, e.g., the base contact 105 and the emitter contact 107, there is a need to etch vias having different depths, which inevitably entails differing etching periods of the respective contact vias. If, for example, the contact via to be produced above the emitter contact 107 is etched for too long, a surface of the emitter contact 107 is affected and damaged, so that the contact vias cannot be etched in one pass without previously taking precautionary measures, which results in the manufacturing process becoming more expensive. The requirements placed upon a selectivity of the contact-via etching up to the emitter contact 107, which consists of polysilicon, for example, are very demanding and also reduce the process window in the step of polishing the BPSG, which may be performed, for example, using the CMP method (BPSG CMP), as well as in the subsequent contact-via etching (CT etch). Due to the increased topology requirements, it is the emitter polysilicon which is always most exposed to the etching attack.

A further disadvantage of the semiconductor device shown in FIG. 1 is the fact that additional contact vias 119, 121 and 123 filled with tungsten as well as the second structured metal plane 125 are required for contacting the respective terminals 103, 105 and 107. On the one hand, this leads to an increase in the process costs, on the other hand a complex manufacturing process consisting of a plurality of process steps must be employed for producing the semiconductor device shown in FIG. 1, so that high demands must be placed upon, e.g., the process stability, which renders the manufacturing process even more expensive.

A further disadvantage of the semiconductor device which is in line with the prior art and is shown in FIG. 1 is the fact that the respective contacts 103, 105 and 107 are contacted via a plurality of contact structures, such as vias 111, 113 and 115 filled with tungsten, first metalization plane 117, vias 119, 121 and 123 filled with tungsten, as well as second metalization plane 125, which is why a high contact resistance, for example, may form due to potential contact inaccuracies, which contact resistance contributes to a deterioration of both the electrical properties (e.g. higher power dissipation) and of the performance of the bipolar transistor.

A further disadvantage of the semiconductor device shown in FIG. 1 is to be seen in the fact that due to the second metalization plane 125 and to the vias 119, 121 and 123 filled with tungsten, a spatial expansion of such a semiconductor structure becomes larger in the vertical direction, so that, for example, higher demands must be placed upon the process stability in producing the BPSG layer 109, which renders the manufacturing process even more expensive.

To increase the process window, which is to be evaluated as critical, it is feasible, for example, to limit the BPSG-CMP specification and to reduce the height of the emitter stack 107 a minimum. By doing so, however, the process window for the contact-via etch/etching is restricted to the same extent, since in the case of the emitter stack 107 being too low, the damaging of same caused by an etching process may be severe.

If, for example, bipolar transistors and field-effect transistors are contacted on a substrate, the height of the emitter stack 107 will see a significant increase compared to, for example, a gate terminal of a CMOS transistor (GC polystack) in future bipolar technologies. In this case, even those contact areas which are situated at the lowest location, e.g. source and drain of a field-effect transistor, which are located, as a maximum, at a height of e.g. 900 nm, must be opened reliably, without remainders, and without attacking and damaging an emitter polysilicon of a bipolar transistor.

SUMMARY OF THE INVENTION

In accordance with a first aspect, the invention provides a method of contacting terminals, the method consisting of the following steps: providing a substrate having a substrate surface, the substrate having a first terminal having a first terminal surface, and a second terminal having a second terminal surface, wherein a distance between the first terminal surface and the substrate surface is smaller than a distance between the second terminal surface and the substrate surface; forming a first insulating layer on the substrate surface and on the first and second terminal surfaces; forming a contact via in the first insulating layer for exposing the first terminal surface; filling the contact via with a conductive material; forming a second insulating layer on the first insulating layer and on the contact via filled with the conductive material; forming an etching mask on the second insulating layer, the etching mask specifying an area for a first contact terminal and an area for a second contact terminal; etching a first recess through the second insulating layer for exposing the conductive material filling the contact via, and etching a second recess through the second and first insulating layers for exposing the second terminal surface using the etching mask; introducing a conductive material into the first recess and into the second recess for producing the first and second contact terminals.

In accordance with a second aspect, the invention provides an arrangement for contacting terminals of a substrate having a substrate surface, a first terminal having a first terminal surface, and a second terminal having a second terminal surface, the first terminal surface being located at a shorter distance from the substrate surface than the second terminal surface, the arrangement having: a first insulating layer on the substrate surface, having an insulation-layer surface being located at a longer distance from the substrate surface than the second terminal surface; a second insulating layer arranged on the first insulating layer; wherein the first insulating layer has a contact via which extends from the insulation-layer surface to the first terminal surface and is filled with a first conductive material, and wherein the second insulating layer has a recess penetrating the former, extending up to the first conductive material, and being filled with a second conductive material; and wherein a recess extends to the second terminal surface through the first and second insulating layers, and is filled with a third conductive material.

In accordance with embodiments of the invention, for contacting terminals a substrate having a substrate surface is initially provided, the substrate having a first terminal having a first terminal surface, and a second terminal having a second terminal surface, a distance between the first terminal surface and the substrate surface being smaller than a distance between the second terminal surface and the substrate surface. A first insulating layer is formed on the substrate surface and on the first and second terminal surfaces. A contact via is formed in the first insulating layer for exposing the first terminal surface. The contact via is filled with a conductive material, and a second insulating layer is formed on the first insulating layer and on the contact via filled with the conductive material. An etching mask is formed on the second insulating layer, the etching mask specifying an area for a first contact terminal and an area for a second contact terminal. A first recess is etched through the second insulating layer for exposing the conductive material filling the contact via, and a second recess is etched through the second and first insulating layers for exposing the second terminal surface using the metalization mask. A conductive material is introduced into the first recess and into the second recess for producing the first and second contact terminals.

Embodiments of the present invention further provide an arrangement for contacting terminals of a substrate having a substrate surface, a first terminal having a first terminal surface, and a second terminal having a second terminal surface, the first terminal surface being located at a shorter distance from the substrate surface than the second terminal surface. The arrangement has the following: a first insulating layer on the substrate surface, having an insulation-layer surface being located at a longer distance from the substrate surface than the second terminal surface, a second insulating layer arranged on the first insulating layer, wherein the first insulating layer has a contact via which extends from the insulation-layer surface to the first terminal surface and is filled with a first conductive material, and wherein the second insulating layer has a recess penetrating the former, extending up to the first conductive material, and being filled with a second conductive material, and wherein a recess extends to the second terminal surface through the first and second insulating layers, and is filled with a third conductive material.

At least some embodiments of the invention are based on the findings that a terminal of a substrate may be contacted using an etching mask if a metal contact is formed.

An advantage of such embodiments is the fact that the contacting of the terminal, whose terminal surface is spaced furthest apart from the substrate surface, is not performed via an additional contact-via plane, but directly via, for example, an overlying metal plane using a conventional single damascene process, whereby the manufacturing process is simplified and manufacturing costs are lowered.

A further advantage of some embodiments is the fact that the problem of differing etching depths for the contact vias, as has been described above, no longer exists. For this reason, for example, a standard contact-via etching and filling need only be varied slightly, which leads to a further simplification of the manufacturing process.

A further advantage of some embodiments of the present invention is to be seen in that a number of contact transitions between the metal terminals and the terminals is reduced, which leads to a reduction in parasitic effects, e.g. contact resistances, and thus to an improvement in the electrical properties, such as the performance of the arrangement.

A further advantage of at least some embodiments of the present invention is the fact that fewer process steps are employed for producing the inventive arrangement as compared with the prior art discussed in FIG. 1, which leads to a further reduction of manufacturing costs.

A further advantage of some embodiments is the fact that due to the inventive contacting of the terminal, whose terminal surface is spaced apart furthest from the substrate surface, the process window is widened, since, on the one hand, there is no problem regarding the structuring of a contact via, and, on the other hand, a height of the terminal may be selected at random, which is an advantage particularly if the terminal must receive, e.g., a large current, which is the case, for example, with power transistors.

A further advantage of some embodiments is to be seen in the fact that due to the reduced number of process steps and due to their complexity, manufacturing rejects are reduced, whereby a manufacturing yield is increased, which leads to a further reduction of manufacturing costs per item processed.

BRIEF DESCRIPTION OF THE DRAWINGS

Embodiments of the present invention will be explained in more detail below with reference to the accompanying figures, wherein:

FIG. 1 shows a conventional semiconductor device;

DESCRIPTION OF PREFERRED EMBODIMENTS

FIG. 2 shows a first embodiment of a method of producing an arrangement for contacting terminals of a substrate in accordance with the present invention. FIG. 2a to 2h illustrate the process steps.

Figure 2C:
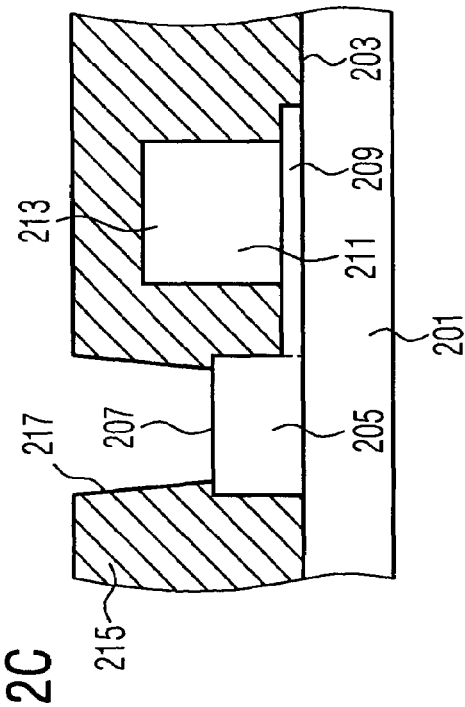
FIG. 2 shows a first embodiment of an inventive method of contacting terminals in accordance with the present invention.
Figure 2D:
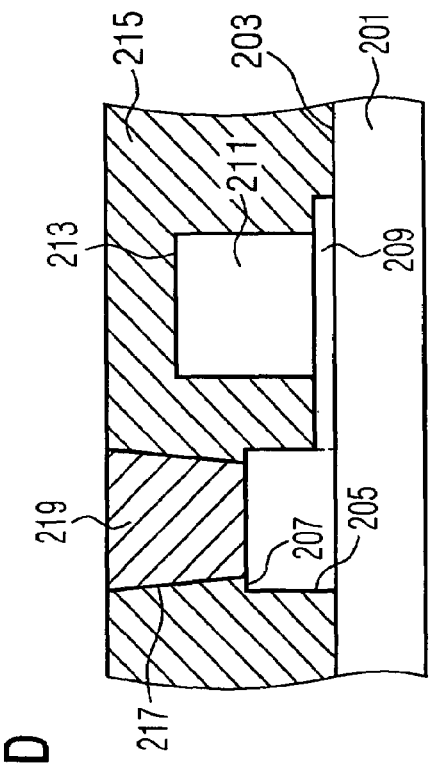
Figure 2A:
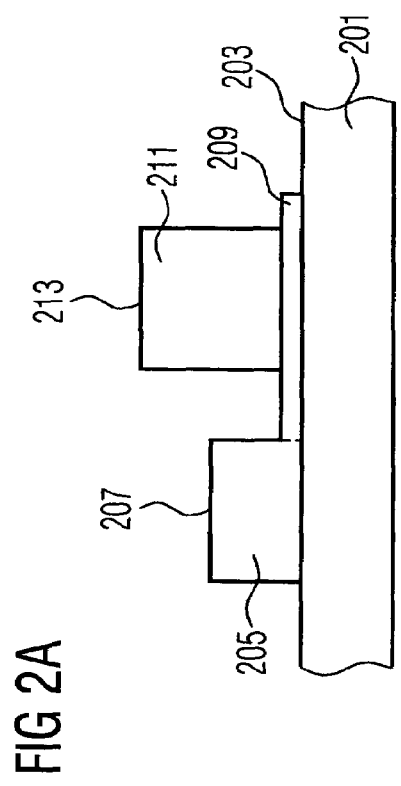

As is shown in FIG. 2a, a substrate 201 is initially provided which has a substrate surface 203. In a further process step, a first terminal 205 having a first terminal surface 207 is produced on the substrate surface 203. In accordance with the embodiment shown in FIG. 2, the first terminal 205 (base of the npn transistor) has a stack 209 on which a second terminal 211 (emitter of the npn transistor) is formed with a second terminal surface 213. Stack 209 (emitter stack) is part of the first terminal 205. It shall be noted at this point, however, that the second terminal 211 need not necessarily be formed on the emitter stack 209. It is also feasible for the first terminal 205 and the second terminal 211 to be formed on substrate 201 in a manner in which they are isolated from each other.

Figure 2B:
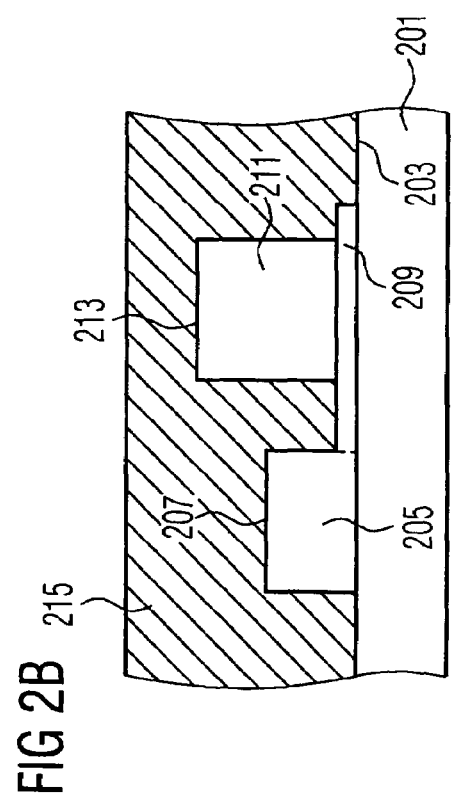

In a further process step, illustrated in FIG. 2b, a first insulating layer 215, e.g. oxide, is formed on the substrate surface 203 as well as on the first and second terminal surfaces 207 and 213. The step of forming the first insulating layer 215 may further include an additional step, wherein the first insulating layer is polished back to a target thickness, wherein the above-mentioned CMP method, for example, may be employed. The target thickness is selected such that the second terminal 213 remains to be covered and is not exposed after the step of polishing the first insulating layer 215.

In a further step, represented in FIG. 2c, a contact via 217 for exposing the first terminal surface 207 is formed in the first insulating layer 215, e.g. by etching into the first insulating layer 215 on the first terminal 205. In a further process step, illustrated in FIG. 2d, contact via 217 is filled with a conductive material 219. The conductive material 219 may be a metal, e.g. tungsten or copper. The steps of filling the contact via 217 with the conductive material 219 includes, for example, a step of applying a conductive layer as well as a step of polishing the conductive layer back to the first insulating layer 215, for example using the above-mentioned CMP method, so that essentially only contact via 217 is filled with the conductive material 219. In doing so, before the conductive material 219 is filled into via 217, via 217 may be lined, for example, with a Ti(N) and/or Ta(N) liner so as to produce a metallurgical barrier against the first insulating layer 215.

Figure 2E:
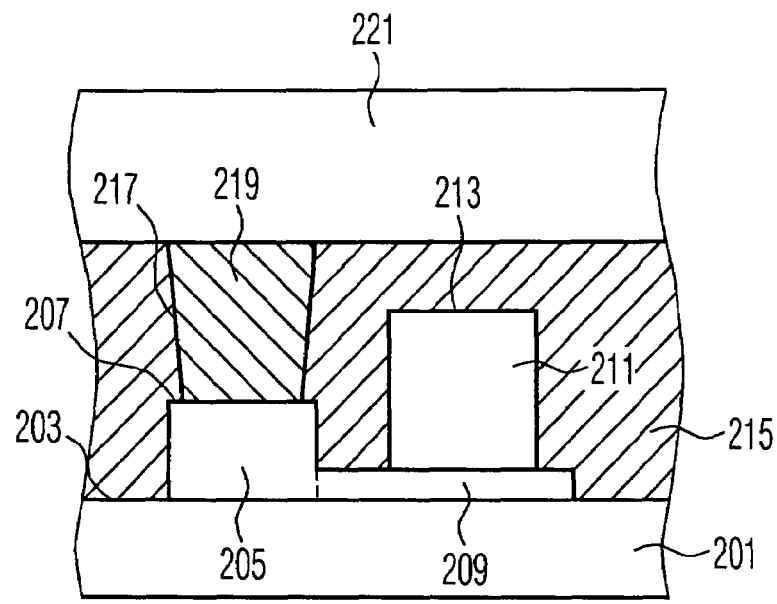

In a further process step, illustrated in FIG. 2e, a second insulating layer 221, e.g. an oxide or the above-mentioned BPSG, is formed on the first insulating layer 215 as well as on the contact via 217 filled with the conductive material 219. In doing so, the second insulating layer is initially deposited, for example, and, in a further step, polished back or etched back, e.g. using the above-mentioned CMP method.

Figure 2F:
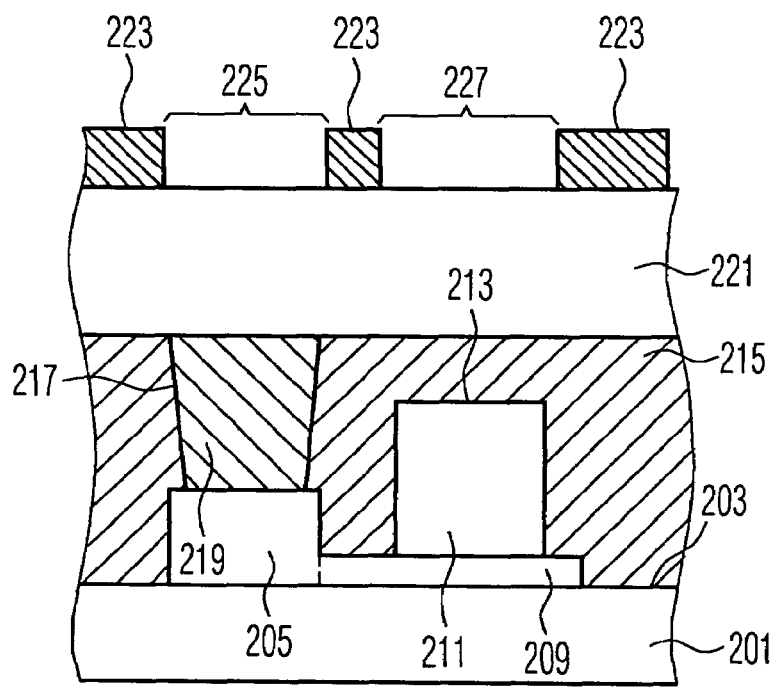

In a further process step, an etching mask 223 is applied to the second insulating layer 221 and structured, as illustrated in FIG. 2f. In structuring the etching mask 223, an area 225 is specified for a first contact terminal and an area 227 is specified for a second contact terminal. The area 225 is formed above the first terminal 205, and the area 227 is formed above the second terminal 211. By the structuring of the etching mask 223, a structure of a metal plane, for example, is defined at the same time, which may be, for example, a wiring plane.

Figure 2G:
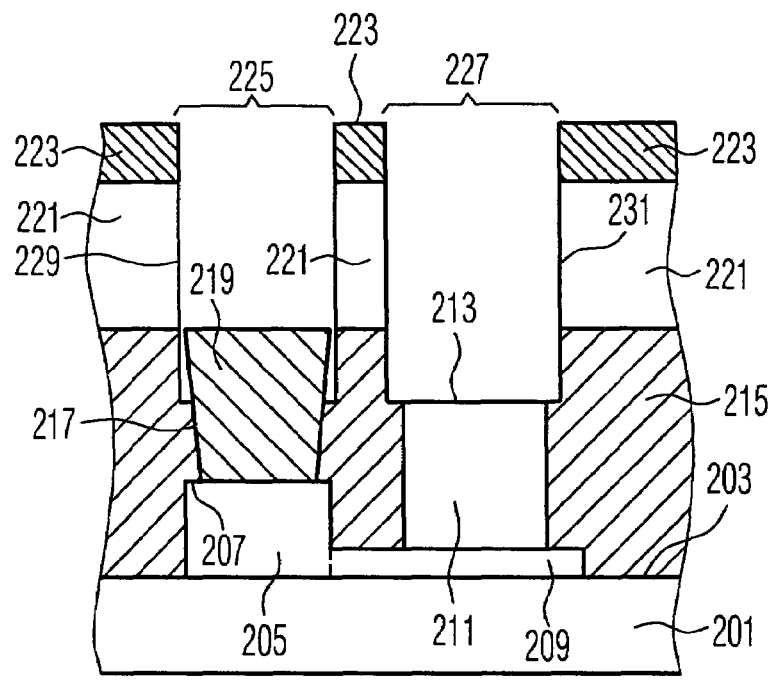

In a further process step, illustrated in FIG. 2g, a first recess 229 and a second recess 231 are etched using etching mask 223, especially in the openings of the etching mask which are defined by areas 225 and 227. While doing so, first recess 229 is etched through the second insulating layer 221 for exposing the conductive material 219 which fills contact via 217. By analogy therewith, the second recess 231 is etched through the second insulating layer 221 as well as through the first insulating layer 215 for exposing the second terminal surface 213 of the second terminal 211. Since the conductive material 219, which fills contact via 217, extends through the first insulating layer 215 up to the second insulating layer 221, and since the second surface 213 is spaced apart from the substrate surface 203 by a smaller distance than an upper surface of the conductive material 219, the step of etching the first and second recesses 225 and 227 includes undercutting, in etching, the conductive material 219 if, for example, the first recess 225 and the second recess 227 are etched in passes of the same duration, since the depth of the second recess 227 is determined by a position of the second surface 213 of the second terminal 211. While doing so, the second surface 213 is less exposed to an etching attack, since etching is performed only up to the second surface 213. On the other hand, the conductive material 219, which fills contact via 217, is a connecting piece with the first terminal 205, so that any initial etching of the conductive material 219 does not have any negative repercussions on an operation of the arrangement, all the more so since the first recess 225 does not extend up to the first surface 207 of the first terminal 205.

Figure 2H:
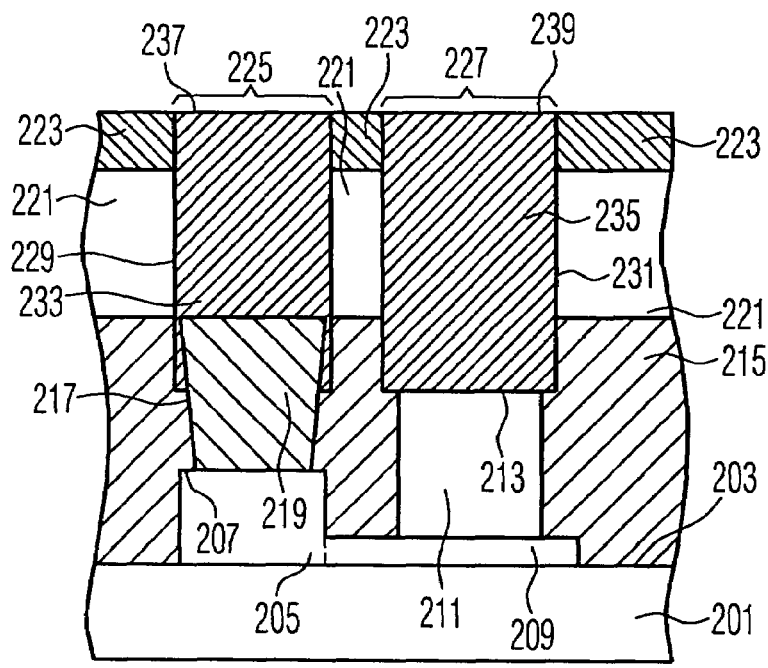

In a further step, illustrated in FIG. 2h, conductive materials 233 and 235 are introduced into the first recess 229 and into the second recess 231, respectively, using the etching mask and, in particular, using the areas 225 and 227 specified by the etching mask, which leads to the creation of a first contact terminal 237 and a second contact terminal 239. The step of introducing the conductive material 233 and the conductive material 235 may be performed by depositing, e.g., metal (e.g. copper), the conductive material 233 and the conductive material 235 consisting of the same metal. However, it shall be noted at this point that the conductive material 233 and the conductive material 235 need not necessarily be the same metal. It is feasible, for example, for copper to be deposited in the first recess 229 and for, e.g., tungsten or a different metal to be deposited in the second recess 231. In addition, the conductive materials 233 and 235 need not necessarily be metals. It is also feasible for the first recess 229 and/or for the second recess 231 to be filled up with a conductive substrate, e.g. doped polysilicon.

In a further process step, the etching mask 223 may be removed, for example by etching, so that the first contact terminal 225 and the second contact terminal 227 are freely accessible for contacting laterally as well. In a further process step, a passivation layer, for example, which protects the arrangement against, e.g., corrosion, may be deposited on the second insulating layer 221.

The step of introducing the first conductive material 233 and the second conductive material 235 in recesses 229 and 231, respectively, includes polishing back the conductive material introduced, e.g. up to the surface of 221, if the etching mask has been removed, using, e.g. the above-mentioned CMP method, for example after the deposition.

The process steps described by means of FIG. 2h clearly show that the same etching mask 223 is used for forming the first recess 229 and the second recess 231 as well as for creating the first contact terminal 237 and the second contact terminal 239. If the conductive material 233 and the conductive material 235 are the same conductive material, the first contact terminal 237 and the second contact terminal 239 may be produced in one pass, whereby a contacting of the second terminal 211, for example with the wiring plane, is effected at the same time. While doing so, a contact with the second surface 213 of the second terminal 211 may be structured with any desired degree of precision, so that, e.g., a sufficiently large contact area with the second terminal 211 may be realized, e.g. to achieve a small transition impedance towards the second terminal 211.

In addition, due to the undercutting, shown in FIG. 2g and FIG. 2h, in the formation of the first recess 229; the conductive material 219 filling contact via 217 is exposed such that the conductive material 233 contacts the conductive material 213, which fills contact via 217, both laterally and on the upper surface of the conductive material 219, so that, for example, a transition impedance towards the first terminal 205 is reduced. Due to the fact that the conductive material 219 may be structured in a precise manner on the first surface 207 of the first terminal 205, a small transition impedance is to be expected there as well, whereby, e .g., the electrical properties of the arrangement manufactured in accordance with the invention are improved.

The inventive method of contacting terminals, which method has been discussed in FIGS. 2a-2h, can be utilized, for example, for contacting, e.g., the terminals of a bipolar transistor formed on substrate 201. In this case, the first terminal 205 is a base terminal or a collector terminal, and the second terminal 211 is an emitter terminal of the bipolar transistor. If the first terminal 205 is the base terminal, and if the second terminal 211 is the emitter terminal, it is also feasible to also contact, by means of the inventive method, a collector terminal, not illustrated in FIGS. 2a-2h, such as the terminal 205.

The inventive method may preferably be used for contacting terminals of a field-effect transistor. In this case, the first terminal 205 is, for example, a source or drain terminal, and the second terminal 211 is, for example, a gate terminal. In contrast to the case illustrated in FIGS. 2a-2h, in the contacting of a field-effect transistor, the first terminal 205 would be formed such that it has no pedestal 209 (stack) on which the second terminal 211 is be formed. In this case, the second terminal 211 would rather be arranged on substrate 201 and be spaced apart from the first terminal 205.

In addition it is feasible for one or more first terminals 205 to be provided on substrate 201, which terminal(s) is/are a base terminal or a collector terminal, respectively, of a bipolar transistor, or a gate terminal, a source terminal, or a drain terminal, respectively, of a field-effect transistor. In this case, the inventive method may be used for contacting both the terminals of the bipolar transistors and the terminals of the field-effect transistors provided on substrate 201, as has already been discussed with respect to FIGS. 2a-2h.

Figure 3A:
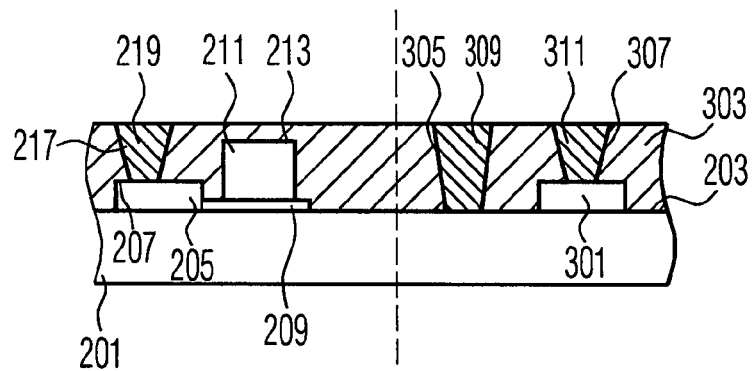
FIG. 3 shows a further embodiment of a method for contacting terminals in accordance with the present invention.
Figure 3B:
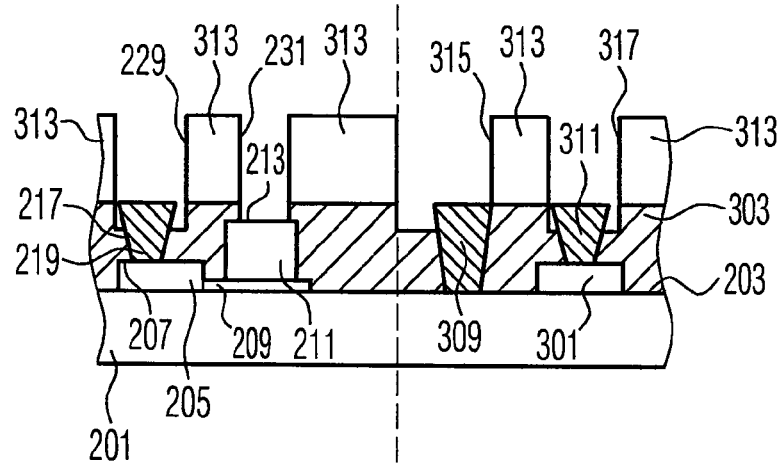
Figure 3C:
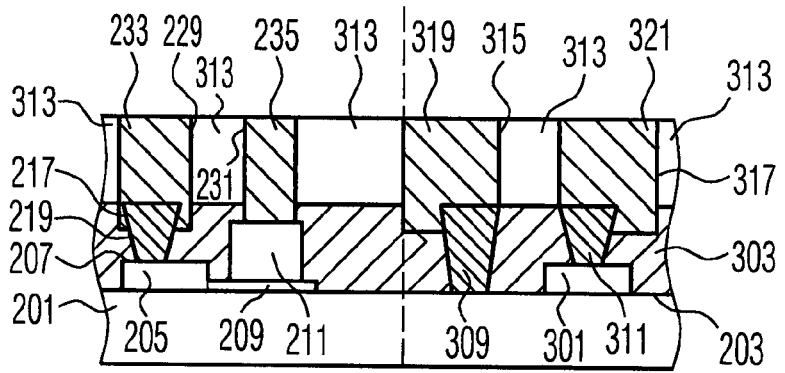

FIG. 3 shows a further embodiment of an inventive method of contacting terminals. FIGS. 3a-3c represent several process steps so as to explain a fundamental concept of the inventive method in contacting, for example, a bipolar transistor and, for example, a field-effect transistor. The vertical line shown in FIGS. 3a-3c identifies, in each case, a bipolar-transistor area extending to the left of the line, and a field-effect transistor area extending to the right of the line. For reasons of clarity, a representation of the collector terminal, or of its contacting, has been dispensed with in FIGS. 3a-3c. However, it shall be noted that the contacting of the collector terminal may be effected in parallel with that of the base terminal, using the same process steps. The position of the collector terminal may correspond to that shown in FIG. 1.

In the following description of the preferred embodiment of FIG. 3, elements which have already been explained with respect to FIGS. 2a-2h will be assigned the same reference numerals. No new description of these elements will be given. In addition, identical elements are assigned identical reference numerals in the figures.

FIG. 3a represents a condition of the inventive arrangement which corresponds to that represented in FIG. 2d. As is shown in FIG. 3, on the substrate surface 203, a first insulating layer 303 laterally extends on the substrate 201 into the field-effect transistor area. The substrate 203 further has a gate terminal 301 consisting, for example, of polysilicon and being formed on the substrate surface 203.

In a further process step, the further contact vias 305 and 307 are formed, for example by etching into the insulating layer 303. Preferably, the further vias 305 and 307 are formed in one pass together with contact via 217. However, it is also feasible to initially form, for example, the further contact via 305 and to produce the contact vias 217 and 307 in a further process step. The contact via 307 extends through the insulating layer 303 up to the substrate surface 201 so as to expose, for example, a further terminal which is not shown in FIG. 2a and is, for example, a source or drain terminal of a field-effect transistor. The further terminal of the field-effect transistor is located, for example, in substrate 201 and is arranged, for example, to the left of the gate terminal 301.

Contact via 307 extends through the insulating layer 303 to the gate terminal 301, so that an area of a surface of the gate terminal is exposed. In a further process step, contact via 217 is filled with the conductive material 219, the further contact via 305 is filled with a conductive material 309, and the further contact via 307 is filled with a conductive material 311. The conductive material 319 may be the same as the conductive material 309 and as the conductive material 311. In this case, for example in the step of forming the respective conductive materials 217, 309 and 311, e.g. a metal, which may be tungsten, is deposited, e.g. in one pass. However, it shall be noted at this point that the conductive materials 217, 309 and 311 are different from one another, so that metals which are different in each case are introduced, e.g., into contact vias 217, 305 and 307. As has already been explained in connection with the embodiment shown in FIG. 2, the conductive materials 217, 309 and 311 need not necessarily consist of metal. It is also feasible for a metal mixture to be introduced into vias 217, 305 and 307. In addition, it is also feasible that the conductive materials 219, 309 and 311 are not metals, but, e.g., a conductive polysilicon deposited, e.g., in contact vias 217, 305 and 307.

In a further process step, the conductive materials 219, 309 and 311 which have been introduced into the contact vias 217, 305 and 307 are polished back, for which purpose use may be made, for example, of the CMP method already explained.

FIG. 3b represents further steps of the inventive method. Initially, a second insulating layer, for example an oxide, is arranged on the insulating layer and on the conductive materials 219, 309 and 311. In a further step, a further etching mask is deposited on the second insulating layer 313, which further etching mask is not illustrated in the embodiment shown in FIG. 3b. Using the further etching mask, a third recess 315 as well as a fourth recess 317 are formed, in a further step, for example jointly with the first recess 229 and with the second recess 231. However, it shall be noted at this point that the third recess 315 as well as the fourth recess 317 may be formed in a further step once the first and second recesses 229 and 231 have been formed. If recesses 229, 231, 315 and 317 are formed in one pass, for example by etching, a depth of the recesses is specified by a height of the second terminal 211, i.e. a position of the second surface 213. Here, both the conductive material 219 and the conductive materials 309 and 311 are exposed, and, as is illustrated in the picture shown in FIG. 2*b*, undercut, so that recesses 229, 315 and 317 extend such that, e.g., the further conductive material 311 is disposed also laterally up to a certain height.

FIG. 3*c* illustrates further steps of the inventive method. A conductive material 319 is introduced into the third recess 315, and a conductive material 321 is introduced into the fourth recess 317, the conductive materials 319 and 321 being formed, for example, in one pass together with the conductive materials 233 and 235, a metal, e.g. copper, being deposited. Thereby, the conductive materials 309 and 311 as well as the conductive material 219 and the second terminal 211, which may be, for example, an emitter terminal of a bipolar transistor, are contacted in one pass, as has already been discussed in connection with the embodiment shown in FIG. 2.

Contrary to the conventional process, the second terminal 211, which may be, for example, an emitter, is not contacted in a contact-via plane CT (W plug) but, e.g., in the framework of a metal-1 single damascene process. Once polishing of, e.g., the conductive material 219, which may be tungsten, has been performed, the polishing being performed, for example, using the CMP method, a further processing for forming an emitter contacting is effected, for example using a conventional copper (Cu) single damascene process so as to produce the metal plane, which may be, for example, a metal-1 plane. For this purpose, e.g. oxide is deposited on the whole surface area and structured, preferably by means of plasma etching, on a resist mask. Thereafter, the liner/seed deposition, and, for example, electrochemical filling of the oxide trenches with copper are effected. The latter is polished back to the oxide level in a subsequent polishing step, it being possible to use, preferably, the CMP method already mentioned.

As has already been described in detail, the pattern transfer for the emitter contact is also effected by means of the etching mask (metal-1 mask), a metal etching (M1 etch) being effected such that the etching of the oxide/BPSG is preferably performed up to a height of the emitter. Subsequently, the nitride liner, which has been deposited, for example, beneath the BPSG, is recessed in a further plasma etching step. Thus, the emitter is, just like the M1 webs, filled with copper and thereby contacted. For cleaning the emitter surface, wet etching and/or a plasma preclean may be employed. In this case, only a small change, e.g. as compared to a standard M1 cleaning, would be necessary.

As has already been mentioned, the inventive method no longer features the problem of different etching depths for the contact via, i.e. the standard contact-via etching and filling need only be varied slightly. Preferably the contacting of the emitter is effected directly above the overlying metal-1 plane, using a conventional single damascene process, and no longer above the contact-via plane, as is known from the prior art.

Figure 4:
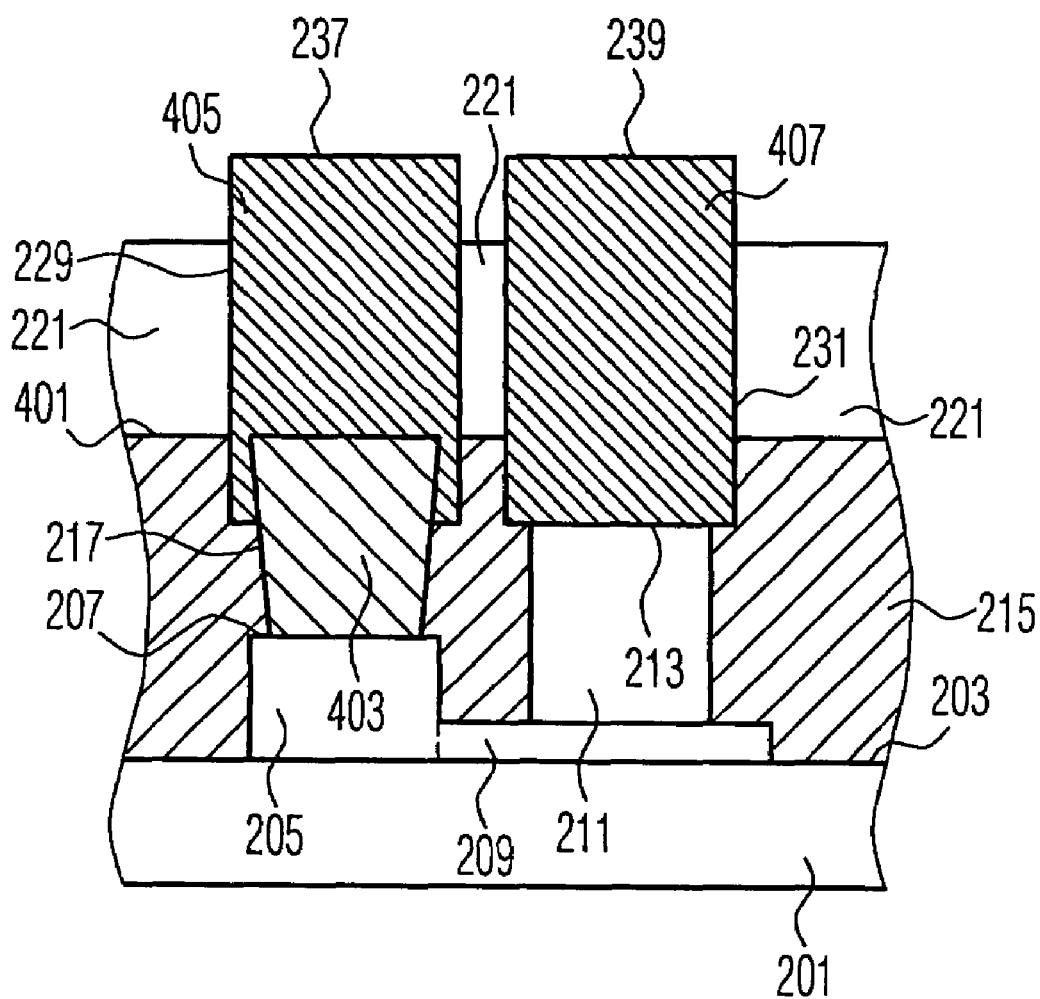
FIG. 4 shows a first embodiment of an arrangement for contacting terminals in accordance with the present invention.

FIG. 4 shows a first embodiment of an arrangement for contacting terminals of a substrate, the arrangement shown in FIG. 4 preferably being produced using the inventive method which has already been discussed with respect to FIGS. 2*a*-2*h*.

Unlike the arrangement represented in FIG. 2*h*, which arises after the inventive process steps have been completed, the contact via extending from an insulation-layer surface 401 to the first terminal surface 207 is filled with a first conductive material 403. The first recess 229 is filled with a second conductive material 405. The second recess 231 is filled with a first conductive material 407.

In addition, the arrangement illustrated in FIG. 4 no longer has the etching mask 223 illustrated in FIG. 2*h*.

Due to the fact that the insulation-layer surface 401 is located at a longer distance from the substrate surface 203 than the second terminal surface 213, the first conductive material 403 is formed to be higher than the second terminal 211. The first conductive material 403 is conductively connected to the second conductive material 405, the conductive connection not only being formed on an upper surface of the conductive material 403, but also to the side of same, so that, as has already been mentioned, a small transition impedance arises between the first contact terminal 237 and the first terminal 205. In addition, the conductive material 403 may be removed, in the production of 229, partially or completely down to the level of the surface 213. In addition, the second terminal surface 213 of the second terminal 211 contacts the third conductive material 407 on the whole surface area, so that, e.g., a small transition impedance arises between the second contact terminal 239 and the second terminal 211.

In the embodiment shown in FIG. 4, the first conductive material 403 is, e.g., tungsten or a different material which is conductive, such as polysilicon. The second conductive material 405 and the third conductive material 407 may be, e.g., copper or tungsten, too. However, it is also feasible for the conductive materials 403, 405 and 407 to be, for example, metal compounds composed of different metals.

Since the first contact terminal 237 and the second contact terminal 239, form, e.g., a wiring plane, the first terminal 205 and the second terminal 211 may be contacted via contact terminals 237 and 239 so as to put into operation the arrangement shown in FIG. 4.

The arrangement illustrated in FIG. 4 may further be, e.g., a bipolar transistor contacted via the contact terminals 237 and 239. In this case, the first terminal 205 is, e.g., a base terminal of the bipolar transistor, and the second terminal 211 is, for example, an emitter terminal of the bipolar transistor, a collector terminal, which is formed, e.g., in the substrate 201, not being illustrated. However, the collector terminal may be contacted in the same manner, as is the case with the first terminal 205.

The inventive arrangement may be used, for example, in the designs of the chip generations for GSM or UMTS applications (mobile phone, WLAN). For this purpose, low-loss and fast switching elements are required for setting a carrier frequency (triple- and quadruple-band elements) and for operating power amplifiers. These switching elements currently (and in the foreseeable future) may only be implemented by bipolar transistors on a silicon basis, which is formed, e.g., by substrate 201. Future CMOS shrink generations have not yet been able to prove their applicability. To be able, for example, to provide the UMTS market with drivers and power amplifiers, copper-based bipolar transistors are needed (and are being developed). The inventive arrangement, such as is illustrated, e.g., in FIG. 4, thus may be used in chips for mobile radio applications, since, for example, the inventive method, as has already been explained with respect to FIG. 2, allows a copper contacting of the terminals of a bipolar transistor.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A method of contacting terminals, the method comprising;
   providing a substrate having a substrate surface, the substrate comprising a first terminal having a first terminal surface, and a second terminal having a second terminal surface, wherein a distance between the first terminal surface and the substrate surface is smaller than a distance between the second terminal surface and the substrate surface;
   forming a first insulating layer on the substrate surface and on the first and second terminal surfaces;
   forming a contact via in the first insulating layer for exposing the first terminal surface;
   filling the contact via with a conductive material;
   forming a second insulating layer on the first insulating layer and on the contact via filled with the conductive material;
   forming an etching mask on the second insulating layer, the etching mask specifying an area for the first terminal and an area for the second terminal;
   etching a first recess through the second insulating layer for exposing the conductive material filling the contact via, and etching a second recess through the second and first insulating layers for exposing the second terminal surface using the etching mask;
   introducing a conductive material into the first recess and into the second recess for producing the first and second terminals.

2. The method as claimed in claim 1, wherein the first terminal comprises one of a base terminal and a collector terminal, and the second terminal comprises an emitter terminal, arranged on a stack, of a bipolar transistor.

3. The method as claimed in claim 1, wherein the first terminal comprises one of a source and a drain terminal, and the second terminal is comprises a gate terminal of a field-effect transistor.

4. The method as claimed in claim 1, wherein the first terminal is selected from the group of a base terminal of a bipolar transistor, a collector terminal of a bipolar transistor, a gate terminal of a field effect transistor, a source terminal of a field effect transistor and a drain terminal of a field-effect transistor.

5. The method as claimed in claim 1, wherein introducing the conductive material further comprises introducing metal into at least one of the first recess and the second recess.

6. The method as claimed in claim 1, wherein the filling step includes filling the contact via with tungsten.

7. The method as claimed in claim 1, wherein introducing the conductive material includes introducing copper into the first and second recesses.

8. The method as claimed in claim 1, further including the step of forming a wire plane comprising the first terminal and the second terminal.

9. The method as claimed in claim 1, wherein the step of forming the contact via includes etching the contact via.

10. The method as claimed in claim 1, wherein the etching step includes etching the first recess and the second recess in one pass.

11. The method as claimed in claim 1, wherein introducing the conductive material further comprises introducing the conductive material into the first and second recesses in one pass.

* * * * *